(12) United States Patent
Lee

(10) Patent No.: US 8,068,383 B2
(45) Date of Patent: Nov. 29, 2011

(54) SEMICONDUCTOR INTEGRATED CIRCUIT HAVING ADDRESS CONTROL CIRCUIT

(75) Inventor: Kyong Ha Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 526 days.

(21) Appl. No.: 12/337,521

(22) Filed: Dec. 17, 2008

(65) Prior Publication Data

US 2009/0231947 A1    Sep. 17, 2009

(30) Foreign Application Priority Data

Mar. 12, 2008    (KR) .................. 10-2008-0022763

(51) Int. Cl.
*G11C 8/00* (2006.01)

(52) U.S. Cl. ............................. 365/230.08; 365/230.03

(58) Field of Classification Search ............. 365/230.08, 365/230.03, 233.12
See application file for complete search history.

(56) References Cited

U.S. PATENT DOCUMENTS 6,034,904 A * 3/2000 Kuromiya et al. ............ 365/201
2001/0040827 A1   11/2001 Dosaka et al.
2004/0240254 A1 * 12/2004 Shiga et al. .................... 365/154
2008/0002484 A1    1/2008 Cho

FOREIGN PATENT DOCUMENTS

| JP | 09-022591 | 1/1997 |
| JP | 2006-074436 | 3/2006 |
| KR | 100122099 | 9/1997 |
| KR | 1019980063307 | 10/1998 |
| KR | 1020070009822 A | 1/2007 |
| KR | 1020070109104 A | 11/2007 |

* cited by examiner

*Primary Examiner* — Vu Le

(74) *Attorney, Agent, or Firm* — Baker & McKenzie LLP

(57) ABSTRACT

A semiconductor IC in which a least significant bit of an external address signal is fixed to a signal level, the semiconductor integrated circuit includes an address control circuit configured to produce a carry signal, when a test mode signal is activated, in response to a column command signal and output an address signal, which is sequentially increased from an initial internal address signal, by latching the external address signal as the initial internal address signal and combining the latched initial internal address signal and the carry signal.

41 Claims, 10 Drawing Sheets

SEMICONDUCTOR INTEGRATED CIRCUIT HAVING ADDRESS CONTROL CIRCUIT

CROSS-REFERENCES TO RELATED APPLICATION

The present application claims priority under 35 U.S.C. §119(a) to Korean application number 10-2008-0022763, filed on Mar. 12, 2008, in the Korean Intellectual Property Office, which is incorporated herein by reference in its entirety as is set forth in full.

BACKGROUND

1. Technical Field

The embodiments described herein relate to a semiconductor integrated circuit (IC) and, more particularly, to a semiconductor IC to control an address count.

2. Related Art

Generally, after selecting one word line, an address control circuit of a semiconductor IC produces a series of internal address signals through an internal counter using a column address signal, which is received from an external circuit, as an initial address signal. For example, the address control circuit counts two, four, eight, or sixteen internal address signals or the full page thereof from the received initial address signal according to a burst length. Then, the cell data is read from or written into memory cells by using the sequential internal address signals. This address counting method is called a "wrap type" method or mode because the address signals are wrapped in a predetermined unit.

The wrap type address generation mode can be classified into a sequential mode and an interleave mode that uses a complement in order to reduce toggling. The sequential mode starts the count from the initial address signal, but outputs the internal address signals in a predetermined range. For example, assuming that the internal address signals of Y0, Y1, Y2, Y3, Y4, Y5, Y6, and Y7 are used, the initial address is Y2, and the burst length is 4, wherein Y2, Y3, Y0, and Y1 are output by the address count in the sequential mode. Although the sequential mode is involved in the internal address generation, the sequential address signals are limited to a specific range because the address signals are wrapped in a predetermined range.

SUMMARY

A semiconductor IC capable of sequentially producing address signals is described herein.

In one aspect, a semiconductor IC in which a least significant bit of an external address signal is fixed to a signal level, the semiconductor integrated circuit includes an address control circuit configured to produce a carry signal when a test mode signal is activated, in response to a column command signal and output an address signal, which is sequentially increased from an initial internal address signal, by latching the external address signal as the initial internal address signal and combining the latched initial internal address signal and the carry signal.

In another aspect, a semiconductor IC in which a least significant bit of an external address signal is fixed to a signal level, the semiconductor IC includes an address control circuit configured to receive an external address signal when a test mode signal is activated, in response to a column command signal, divide the external address signal into a first internal address signal and a second internal address signal which is used as initial internal address signal, and provide the first internal address signal which is sequentially increased from the second internal address signal.

In another aspect, a semiconductor IC in which a least significant bit of an external address signal is fixed to a signal level, the semiconductor IC includes an address control circuit configured to receive an external address signal, when a test mode signal is activated, in response to a column command signal and produce first and second internal address signals, the first internal address signal being sequentially increased from the second internal address signal by controlling an inversion of the first internal address signal based on a signal level of the second internal address signal, the address control circuit including a first address latch unit configured to receive the external address signal and the carry signal, divide the external address signal into first and second internal address signals, and provide carry generation address signal, and a second address latch unit configured to provide quarter address signals to designate memory blocks in response to the first and second internal address signals at a read or write operation.

In another aspect, a semiconductor IC includes an address control circuit configured to receive an external address signal when a test mode signal is activated, in response to a column command signal, produce first to fourth internal address signals which are respectively correspondent to memory quarter blocks, and control an inversion of the first to third internal address signals based on a signal level of the fourth internal address signal in order that the first to third internal address signals are sequentially increased from the fourth internal address signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
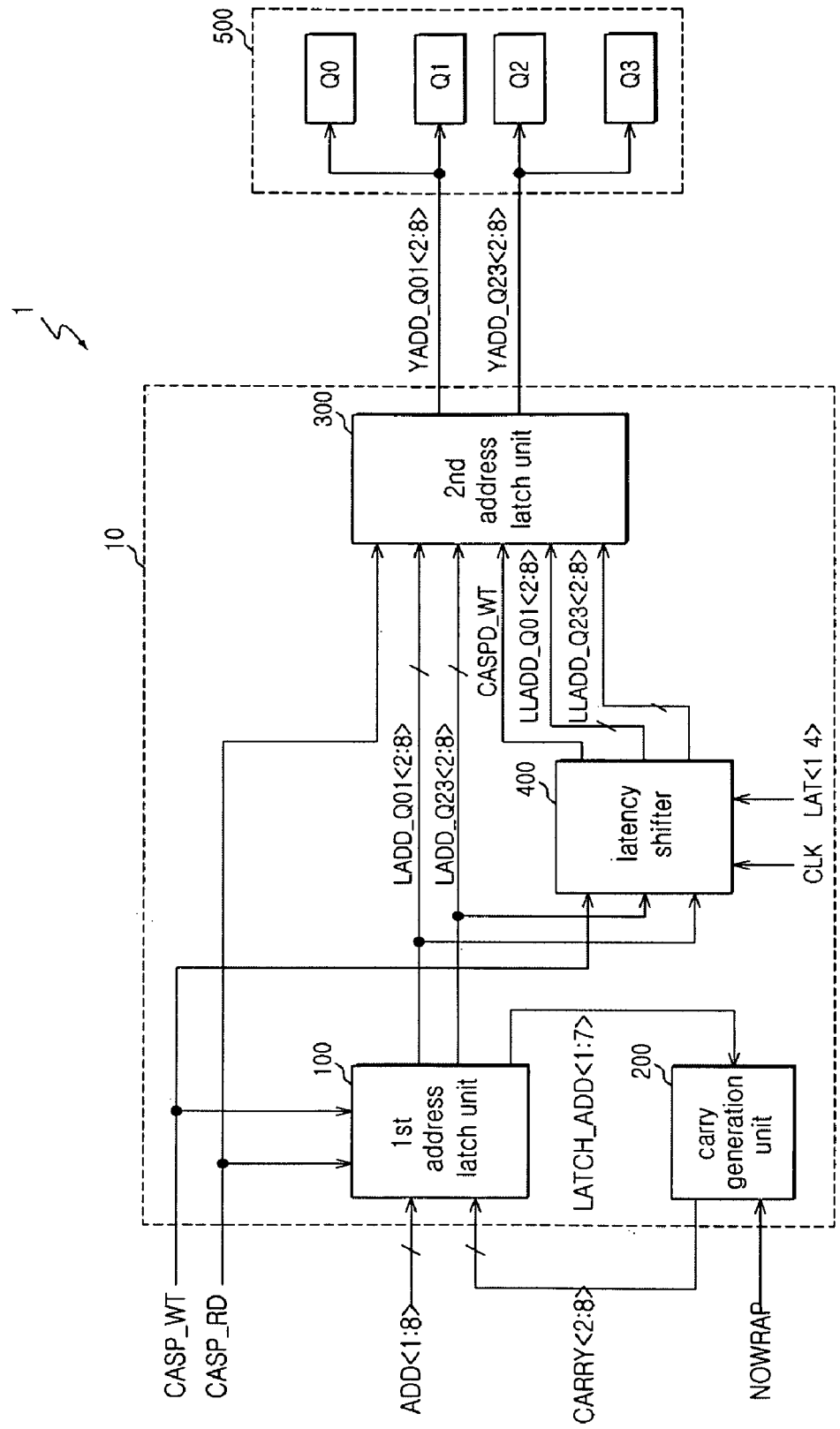
FIG. 1 is a schematic block diagram of an exemplary semiconductor IC according to one embodiment.

FIG. 1 is a schematic block diagram of an exemplary semiconductor IC 1 according to one embodiment. In FIG. 1, the semiconductor IC 1 can be configured to include an address control circuit 10 and a memory block 500.

The address control circuit 10 can include a first address latch unit 100, a carry generation unit 200, a second address latch unit 300, and a latency shifter 400. Here, the first address latch unit 100 can receive an external address signal 'ADD<1:8>' and a carry signal 'CARRY<2:8>' to be provided as feedback, and can generate a first internal address signal 'LADD_Q01<2:8>', a second internal address signal 'LADD_Q23<2:8>', and a carry generation address signal 'LATCH_ADD<1:7>', when receiving from an external circuit a column command signal, such as a read command signal or a write command signal that can be executed simultaneously with the input of a column address signal. For example, the first address latch unit 100 can divide the external address signal 'ADD<1:8>' into the first and second internal address signals 'LADD_Q01<2:8>' and 'LADD_Q23<2:8>' in response to a read command signal 'CASP_RD' or a write command signal 'CASP_WT'. Accordingly, the second internal address signal 'LADD_Q023<2:8>' can be provided with the same level of the external address signal 'ADD<1:8>', but the first internal address signal 'LADD_Q01<2:8>' can be out of phase with the external address signal 'ADD<1:8>' according to the carry signal 'CARRY<2:8>'.

In FIG. 1, the semiconductor IC 1 is shown where a least significant bit (LSB) of the address signal is set to a predetermined level based on the requirement of an external system. Here, the external address signal 'ADD<0>', as the LSB, can be set to a low level, and the external address signal 'ADD<1:8>' can be input with eight bits.

The carry generation unit 200 can receive a sequential increasing mode signal 'NOWRAP' and the carry generation address signal 'LATCH_ADD<1:7>', can generate the carry signal 'CARRY<2:8>', and can provide the carry signal 'CARRY<2:8>' to the first address latch unit 100 through a feedback loop. When the sequential increasing mode signal 'NOWRAP' is activated, the carry generation unit 200 can produce the carry signal 'CARRY<2:8>' that is a delay signal of the carry generation address signal 'LATCH_ADD<1:7>'. Here, the sequential increasing mode signal 'NOWRAP', as a test mode signal, indicates that the address signals are sequentially output, from the initial starting address, in a range of the burst length. The sequential increasing mode signal 'NOWRAP' can be provided by Mode Register Set (MRS). Accordingly, the carry signal 'CARRY<2:8>' can be used as the signal to continuously increase the sequential address signals from a received address signal. Thus, the carry signal 'CARRY<2:8>' can control the inversion of a signal based on the previous address signal bit.

The second address latch unit 300 can produce first and second quarter address signals 'YADD_Q01<2:8>' and 'YADD_Q23<2:8>' in response to the received internal address signal when the read or write command signal is supplied. For example, when receiving an activated read signal 'CASP_RD' the second address latch unit 300 can latch the first and second internal address signals 'LADD_Q01<2:8>' and 'LADD_Q23<2:8>', and can then produce the first and second quarter address signals 'YADD_Q01<2:8>' and 'YADD_Q23<2:8>'. In addition, when receiving an activated write signal 'CASP_WT' the second address latch unit 300 can latch the delayed internal address signals 'LLADD_Q01<2:8>' and 'LLADD_Q23<2:8>', which can be delayed according to a latency for the write operation, and can produce the first and second quarter address signals 'YADD_Q01<2:8>' and 'YADD_Q23<2:8>'. For example, an additional latency may not be required to execute the read operation, but may be required for a write operation.

The latency shifter 400 can produce the delayed address signals that are delayed based on the latency at the write operation. For example, the latency shifter 400 can delay the first and second internal address signals 'LADD_Q01<2:8>' and 'LADD_Q23<2:8>' for a predetermined time, and can output them according to a write latency or an adaptive latency that is required to execute the write operation. Specifically, when the write command signal 'CASP_WT' is supplied, the latency shifter 400 can delay the first and second internal address signals 'LADD_Q01<2:8>' and 'LADD_Q23<2:8>' according to the latency signal 'LAT<1:4>'. The delay time of the first internal address signal 'LADD_Q01<2:8>' can be different from that of the second internal address signal 'LADD_Q23<2:8>'. Furthermore, the latency shifter 400 can provide a delayed write command signal 'CASPD_WT' which is a delayed signal of the write command signal 'CASP_WT' according to the latency signal 'LAT<1:4>'. The latency shifter 400 can operate in synchronization with a rising edge of a clock signal 'CLK'. For example, the latency signal 'LAT<1:4>' can be a signal that is provided by a MRS according to the above-mentioned write latency or adaptive latency.

In FIG. 1, the memory block 500 can include first to fourth quarter blocks Q0-Q3. Here, the first and second quarter blocks Q0 and Q1 can receive the first quarter address signal 'YADD_Q01<2:8>', and the third and fourth quarter blocks Q2 and Q3 can receive the second quarter address signal 'YADD_Q23<2:8>'.

Accordingly, the address signals, which can be continuously and sequentially increased, can be provided to the plurality of quarter blocks by receiving the external address signal 'ADD<1:8>'. Thus, the address control circuit 10 can be controlled in such a manner that the third and fourth quarter blocks Q2 and Q3 can receive the initial address signal. The sequentially increased address signals can be provided to the first and second quarter blocks Q0 and Q1, by producing a carry signal using the address signal, which can be received by the third and fourth quarter blocks, as the initial address signal. Thus, the addressing is not necessarily limited into a predetermined range and the increasing of the sequential address signals can be generated beyond the predetermined range. Here, the sequential addressing can be made within the whole bank.

Figure 2:
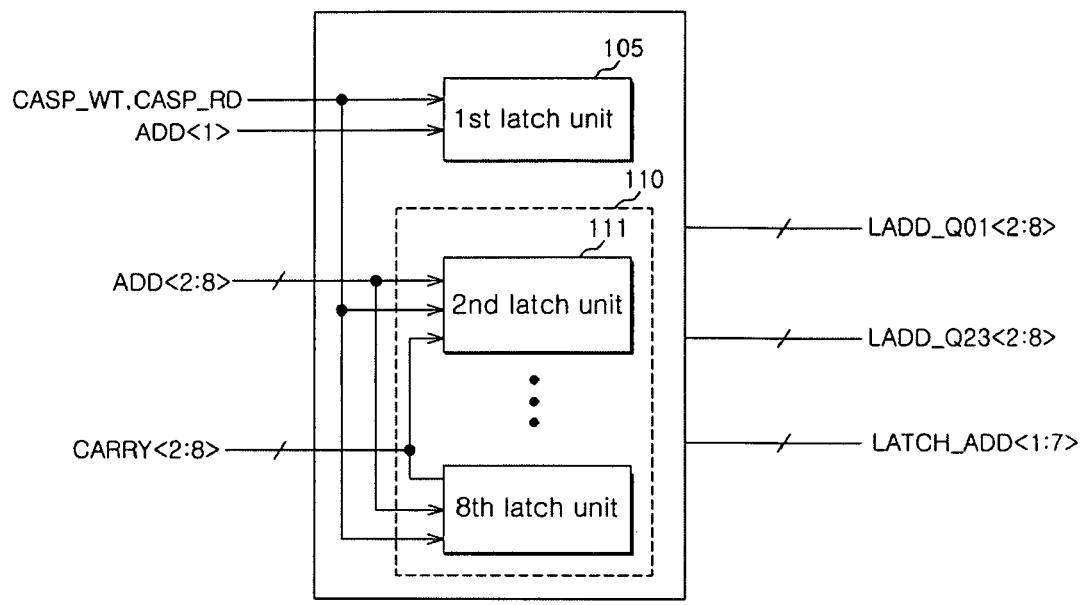
FIG. 2 is a schematic block diagram of an exemplary first address latch unit capable of being implemented in the of FIG. 1 according to one embodiment.

FIG. 2 is a schematic block diagram of an exemplary first address latch unit 100 capable of being implemented in FIG. 1 according to one embodiment. In FIG. 2, the first address latch unit 100 can include a plurality of latch units to receive the external address signal 'ADD<1:8>'. Here, the first address latch unit 100 can be configured to include a first latch unit 105 and an internal address signal generating unit 110. For example, the first address latch unit 100 can include the first latch unit 105 to receive the read or write command signal 'CASP_RD' or 'CASP_WT' and the external address signal 'ADD<1>'. The internal address signal generating unit 110 can include second to eighth latch units 111 that can receive the read or write command signal 'CASP_RD' or 'CASP_WT' the external address signal 'ADD<2:8>', and the carry signal 'CARRY<2:8>', respectively. Here, the configuration of the latch units can be modified based on the presence and absence of the received carry signals 'CARRY<2:8>'. In addition, the first latch unit 105 can receive the read or write command signal 'CASP_RD' or 'CASP_WT' the external address signal 'ADD<1>', and can then produce the carry generation address signal 'LATCH_ADD<1>'.

In FIG. 2, each of the second to eighth units 111 can receive the read or write command signal 'CASP_RD' or 'CASP_WT', the external address signal 'ADD<2:8>', and the carry signal 'CARRY<2:8>', and can then produce the first internal address signal 'LADD_Q01<2:8>', the second internal address signal 'LADD_Q23<2:8>', and the carry generation address signals 'LATCH_ADD<1:7>'.

Figure 3:
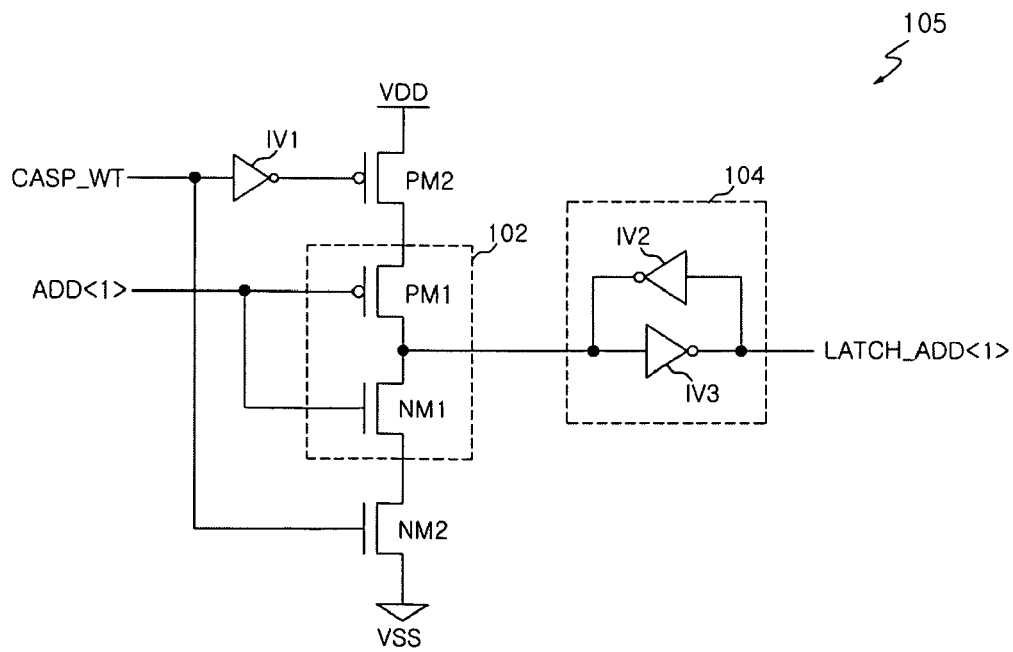
FIG. 3 is a schematic circuit diagram of an exemplary first latch unit capable of being implemented in the unit of FIG. 2 according to one embodiment.

FIG. 3 is a schematic circuit diagram of an exemplary first latch unit 105 capable of being implemented in the unit of FIG. 2 according to one embodiment. In FIG. 3, the first latch unit 105 can be configured to include an address receiving unit 102 and a latch unit 104. For the sake of brevity, only the first latch unit 105 that receives the write command signal 'CASP_WT' will be exemplarily described. However, an additional latch unit, which is in response to the read command signal 'CASP_RD', can be provided. The configuration and operation of this additional latch unit can be substantially the same as those of the first latch unit 105 so that the detailed description will be omitted here.

In FIG. 3, the address receiving unit 102 can include a first PMOS transistor PM1 and a first NMOS transistor NM1. Here, the first PMOS transistor PM1 has a gate terminal to which the external address signal 'ADD<1>' can be supplied, a source terminal to which a drain of a second PMOS transistor PM2 can be connected, and a drain to which a drain of the first NMOS transistor NM1 can be connected. The first NMOS transistor NM1 has a gate terminal to which the external address signal 'ADD<1>' can be supplied, a source terminal to which a drain of a second NMOS transistor NM2 can be connected, and the drain to which the drain of the first PMOS transistor PM1 can be connected.

The latch unit 104 can invert and latch a signal from the address receiving unit 102. Here, the latch unit 104 can include second and third inverters IV2 and IV3, wherein the second and third inverters IV2 and IV3 can be connected to each other in a latch-type configuration.

In FIG. 3, the second PMOS transistor PM2 can be turned ON in response to an inverted signal of the write command signal 'CASP_WT' and the second NMOS transistor NM2 can be turned ON in response to the write command signal 'CASP_WT'. The second PMOS transistor PM2 has a gate terminal to which an inverted signal of the write command signal 'CASP_WT' can be supplied through a first inverter IV1, a source terminal to which an external supply voltage VDD can be supplied, and a drain terminal to which the first PMOS transistor PM1 can be connected. The first PMOS transistor PM1 has a gate terminal to which the write command signal 'CASP_WT' can be supplied, a source terminal to which a ground voltage VDD can be supplied, and a drain terminal to which the first NMOS transistor NM1 can be connected.

An exemplary operation of the first latch unit 105 will be described with reference to FIG. 3.

At the time of the write operation, the write command signal 'CASP_WT' can be activated. The second PMOS transistor PM2, which can receive a low level signal through the first inverter IV1, can be turned ON. For example, when the write command signal 'CASP_WT' is activated and the external address signal 'ADD<1>' is at a high level, the first NMOS transistor NM1 can be turned ON. Accordingly, an inverted low level signal can be supplied to the latch unit 104. Thus, the inverted signal can be provided as the carry generation signal 'LATCH_ADD<1>' by the latch unit 104. Here, the carry generation signal 'LATCH_ADD<1>' can be used for generating only the carry signal, but not for addressing the quarter blocks Q0-Q4 (in FIG. 1).

Figure 4:
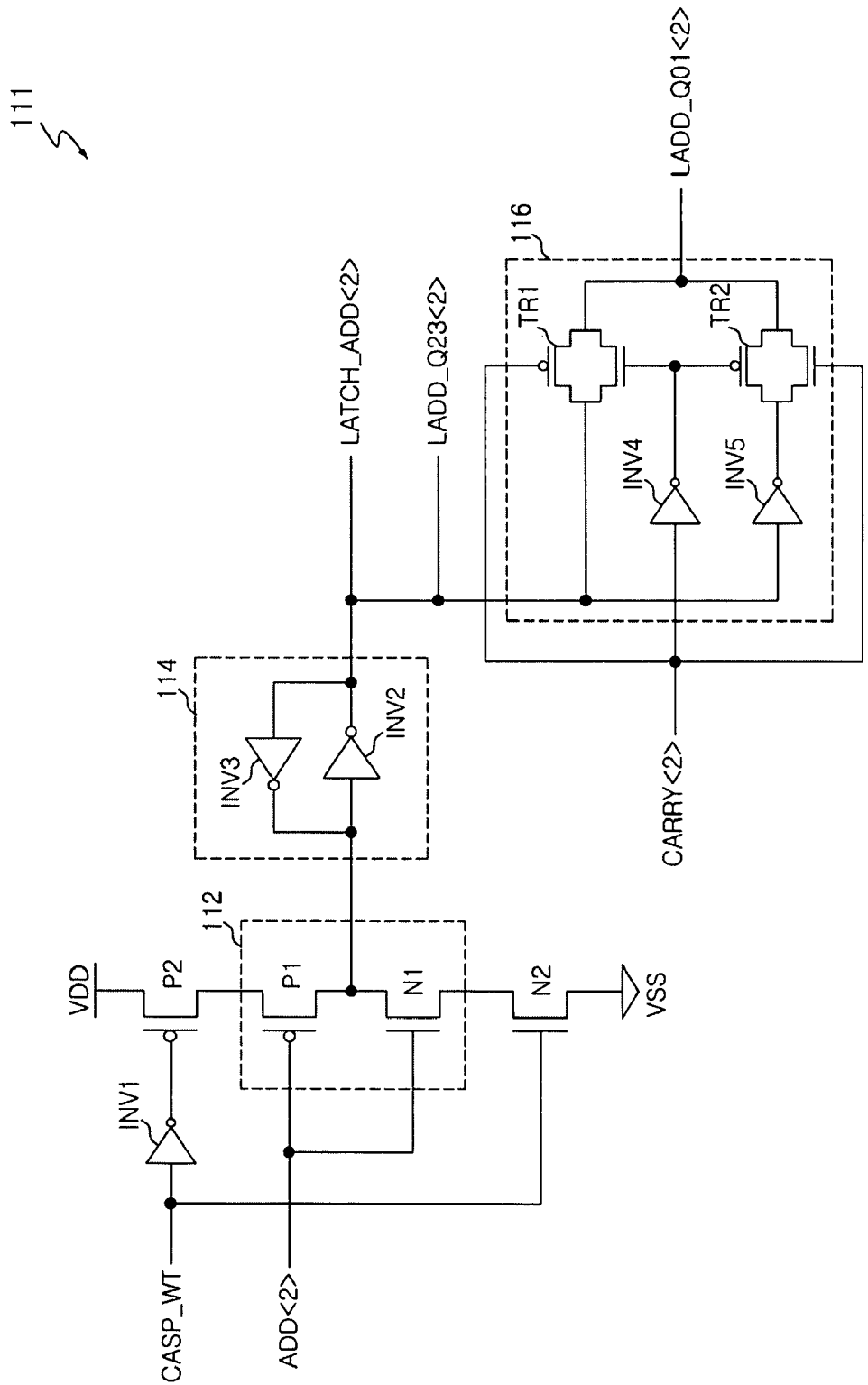
FIG. 4 is a schematic circuit diagram of an exemplary second latch unit capable of being implemented in the unit of FIG. 2 according to one embodiment.

FIG. 4 is a schematic circuit diagram of an exemplary second latch unit 111 capable of being implemented in the unit of FIG. 2 according to one embodiment. In FIG. 4, since the second to eighth latch units 111 can have substantially the same configuration and can execute substantially the same operation, only the second latch unit 111 will be described in detail.

In FIG. 4, the second latch unit 111 can be configured to include an address receiving unit 112, a latch unit 114, and a transfer unit 116. The address receiving unit 112 can include a first PMOS transistor P1 and a first NMOS transistor N1. The first PMOS transistor P1 has a gate terminal to which the external address signal 'ADD<2>' can be supplied, a source terminal to which a drain of a second PMOS transistor P2 can be connected, and a drain terminal to which a drain of the first NMOS transistor N1 can be connected. The first NMOS transistor N1 has a gate terminal to which the external address signal 'ADD<2>' can be supplied, a source terminal to which a drain of a second NMOS transistor N2 can be connected, and a drain terminal to which the drain of the first NMOS transistor N1 can be connected.

In addition, the second PMOS transistor P2 can be turned ON in response to an inverted signal of the write command signal 'CASP_WT' and the second NMOS transistor N2 can be turned ON in response to the write command signal 'CASP_WT'. The second PMOS transistor P2 has a gate terminal to which the inverted signal of the write command signal 'CASP_WT' can be supplied through a first inverter INV1, a source terminal to which the external supply voltage VDD can be supplied, and a drain terminal to which the first PMOS transistor P1 can be connected. The first PMOS transistor P1 has a gate terminal to which the write command signal 'CASP_WT' can be supplied, a source terminal to which the ground voltage VDD can be supplied, and a drain terminal to which the first NMOS transistor N1 can be connected.

The latch unit 114 can invert and latch a signal from the address receiving unit 112, and can produce the carry generation signal 'LATCH_ADD<2>' and the internal address signal 'LADD_Q23<2>'. For example, the latch unit 114 can include second and third inverters INV2 and INV3, wherein the second and third inverters INV2 and INV3 can be coupled to each other in a latch-type configuration.

In FIG. 4, the transfer unit 116 can produce the first internal address signal 'LADD_Q01<2>', which can have substantially the same level as the second internal address signal 'LADD_Q23<2>' or can have an inverted voltage level of the second internal address signal 'LADD_Q23<2>', according to the signal level of the carry signal 'CARRY<2>'. For example, the transfer unit 116 can include a first transfer gate TR1, a second transfer gate TR2, and fourth and fifth inverters INV4 and INV5.

The first transfer gate TR1 can produce the first internal address signal 'LADD_Q01<2>', which can have substantially the same signal level as the second internal address signal 'LADD_Q23<2>', being turned ON in response to the carry signal 'CARRY<2>', which can be inactivated at a low level. In addition, the second transfer gate TR2 can produce the first internal address signal 'LADD_Q01<2>', which can have the inverted voltage level of the second internal address signal 'LADD_Q23<2>', being turned ON in response to the carry signal 'CARRY<2>', which can be activated at a high level. Accordingly, the second latch unit 111 can receive the second address signal 'ADD<2>', and then can provide the first internal address signal 'LADD_Q01<2>' and the second internal address signal 'LADD_Q23<2>', which can be separated from each other. However, the inversion of the first internal address signal 'LADD_Q01<2>' can be determined by the signal level of the carry signal 'CARRY<2>'.

In the operation of the second latch unit 111, the second PMOS transistor P2 and the second NMOS transistor N2 can be turned ON in response to the write command signal 'CASP_WT' which can be activated at the write operation. The first PMOS transistor P1 or the first NMOS transistor N1 can be selectively turned ON in response to the signal level of the external address signal 'ADD<2>'. For example, when the external address signal 'ADD<2>' is at a high level, the first NMOS transistor N1 can be turned ON. Accordingly, an inverted low level signal can be provided to the latch unit 114, and the carry generation signal 'LATCH_ADD<2>' can be produced by an inverted latch signal of the latch unit 114.

The carry generation signal 'LATCH_ADD<1:2>', which can be generated by the first latch unit 105 (in FIG. 3) and the second latch unit 111, can be involved in generating the plurality of bits of the carry signal 'CARRY<2:8>', wherein the carry signal generation will be described below.

Figure 5:
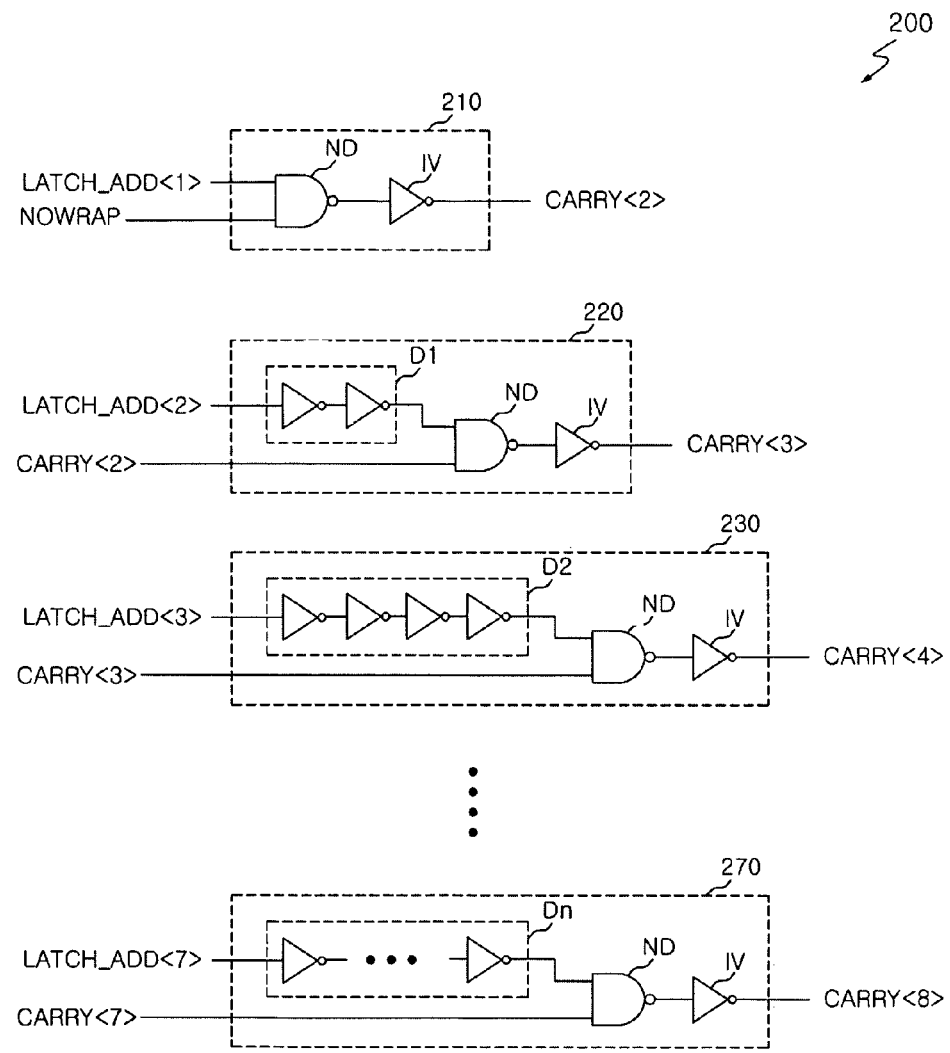
FIG. 5 is a schematic circuit diagram of an exemplary carry generation unit capable of being implemented in the of FIG. 1 according to one embodiment.

FIG. 5 is a schematic circuit diagram of an exemplary carry generation unit 200 capable of being implemented in FIG. 1 according to one embodiment. In FIG. 5, the carry generation unit 200 can includes first to seventh signal generating units 210-270. Here, the plurality bits of the carry signal 'CARRY<2:8>' generated by the carry generation unit 200 can be used as a signal to continuously increase the sequential address signals from a previously received address signal. For example, the plurality bits of the carry signal 'CARRY<2:8>' can be used to determine an inversion based on the previous address signal.

In FIG. 5, the first signal generating unit 210 can produce the carry signal 'CARRY<2>' in response to the carry generation signal 'LATCH_ADD<1>' and the sequential increasing mode signal 'NOWRAP'. The first signal generating unit 210 can include a NAND gate ND and an inverter IV, wherein the NAND gate ND can receive the carry generation signal 'LATCH_ADD<1>' and the sequential increasing mode signal 'NOWRAP'. Here, the inverter can invert an output signal of the NAND gate ND. When the sequential increasing mode signal 'NOWRAP' is activated, the first signal generating unit 210 can produce the carry signal 'CARRY<2>', which can have substantially the same signal level as the carry generation signal 'LATCH_ADD<1>'.

In FIG. 5, the second signal generating unit 220 can produce the carry signal 'CARRY<3>' in response to the carry generation signal 'LATCH_ADD<12' and the carry signal 'CARRY<2>'. The second signal generating unit 210 can also include a delayer D1, a NAND gate ND, and an inverter IV. Here, the NAND gate ND can perform a NAND operation of the carry signal 'CARRY<2>' and a delay signal, and the delay signal can be generated by delaying the carry generation signal 'LATCH_ADD<2>' through the delayer D1. Accordingly, the delay amount of the delayer D1 can be determined to satisfy a signal generation time required to produce the carry signal 'CARRY<2>' in the first signal generating unit 210. For example, the delayer D1 can delay the carry generation signal 'LATCH_ADD<2>' for a sufficient time to produce the carry signal 'CARRY<2>' such that a stable signal level can be received via the delayer D1. The operation of the first signal generating unit 210 can be substantially similar to that of the second signal generating unit 220. For example, when the carry signal 'CARRY<2>' is at a high level, the carry signal 'CARRY<3>', which can have substantially the same level as the carry generation signal 'LATCH_ADD<2>', can be produced.

The configuration of a third signal generating unit 230 can be substantially similar to that of the second signal generating unit 220. However, a delayer D2 of the third signal generating unit 230 can be different from the delayer D1 of the second signal generating unit 220 in the delay time. Similar to the delayer D1, the delayer D2 can have the delay time to satisfy the generation time of the carry signal 'CARRY<3>'. For example, the carry generation signal 'LATCH_ADD<1:3>' can be a signal having substantially the same level as the second internal address signal 'LADD_Q23<2:8>' generated by the first address latch unit 100 and this signal can be simultaneously produced. Accordingly, stable operations in the first to third signal generating units 210 to 230 cam be achieved by making the delay times of the carry generation signal 'LATCH_ADD<1:3>' be different from each other through the delayers D1 and D2. As a result, in the signal generating units of FIG. 5, the different delayers, each of which can have a different delay time, can be used for stably receiving the carry signal 'CARRY<2:8>' generated at the pre-stage.

In order to sequentially increase the next address signals, the signal levels of the carry signal 'CARRY<2:8>' can be determined base on the carry generation address signal (or the second internal address signal 'LADD_Q23<2:8>') from the pre-stage. The address signals, which can be sequentially increased one-by-one from the input address signal, can be produced by inverting the signal levels of the carry generation address signal according to the signal levels of the carry signal 'CARRY<2:8>'. For example, the meaning of the activation of the carry signal 'CARRY<2:8>' includes inverting the next address signal and generating the next address signal once more using the previous address signal generated at the pre-stage. By doing so, the carry signal 'CARRY<2:8>' can be generated to sequentially increase the address signal one-by-one and the signal levels of the input address signal can be inverted according to the generated carry signal 'CARRY<2:8>'. Thus, the generated carry signal 'CARRY<2:8>' can be fed back to the first address latch unit 100 (in FIG. 1), and the signal levels of the received first internal address signal 'LADD_Q01<2:8>' can be inverted according to the signal levels of the carry signal 'CARRY<2:8>'.

Figure 6:
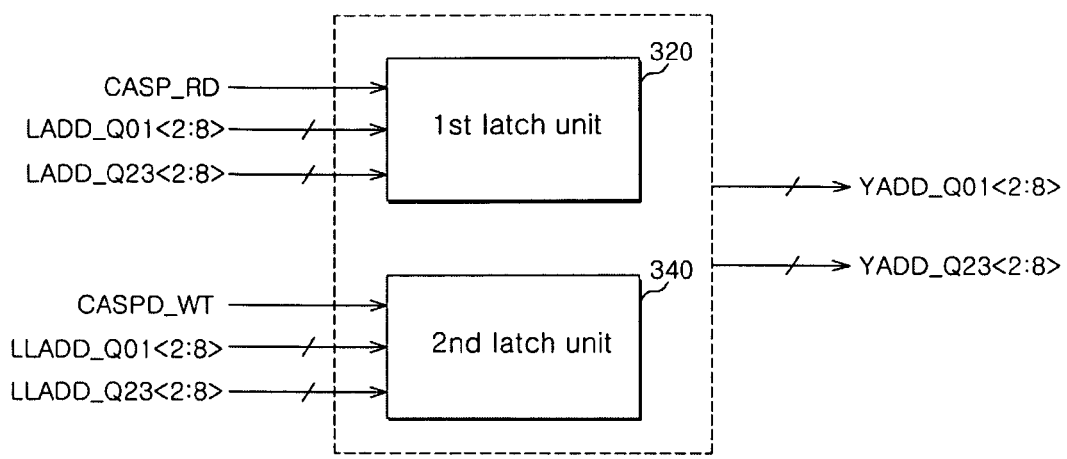
FIG. 6 is a schematic block diagram of an exemplary second address latch unit capable of being implemented in the of FIG. 1 according to one embodiment.

FIG. 6 is a schematic block diagram of an exemplary second address latch unit 300 capable of being implemented in FIG. 1 according to one embodiment. In FIG. 6, the second address latch unit 300 can includes a first latch unit 320 and a second latch unit 340.

The second address latch unit 300 can latch the address signal once more again according to the read or write command signal. For example, the first latch unit 320 can be an address latch unit correspondent to the read command signal and the second latch unit 340 can be an address latch unit correspondent to the write command signal. Here, the first latch unit 320 can be omitted from FIG. 6 according to the configuration or scheme of the semiconductor IC.

The first latch unit 320 can receive the read command signal 'CASP_RD' and the first and second internal address signals 'LADD_Q01<2:8>' and 'LADD_Q23<2:8>', and can then produce first and second quarter address signals 'YADD_Q01<2:8>' and 'YADD_Q23<2:8>'. In addition, the second latch unit 340 can receive the delayed write command signal 'CASPD_WT' and the delayed first and second internal address signals 'LLADD_Q01<2:8>' and 'LLADD_Q23<2:8>', and can then produce first and second quarter address signals 'YADD_Q01<2:8>' and 'YADD_Q23<2:8>'.

Here, the first latch unit 320 can be different from the second latch unit 340 with regard to the input signals. For example, at the write operation, it is necessary to delay the write command signal 'CASP_WT' or the first and second internal address signals 'LADD_Q01<2:8>' and 'LADD_Q23<2:8>' for a predetermined time according to the latency for the write operation. The delay of the write command signal 'CASP_WT' or the first and second internal address signals 'LADD_Q01<2:8>' and 'LADD_Q23<2:8>' according to the latency at the write operation will be described below.

In FIG. 6, the detailed circuits of the first and second latch units 320 and 340 are not shown. However, each of the first and second latch units 320 and 340 can include a plurality of latch units, each of which can have substantially the same configuration as the latch unit of FIG. 3. Thus, the detailed description will be omitted.

Figure 7:
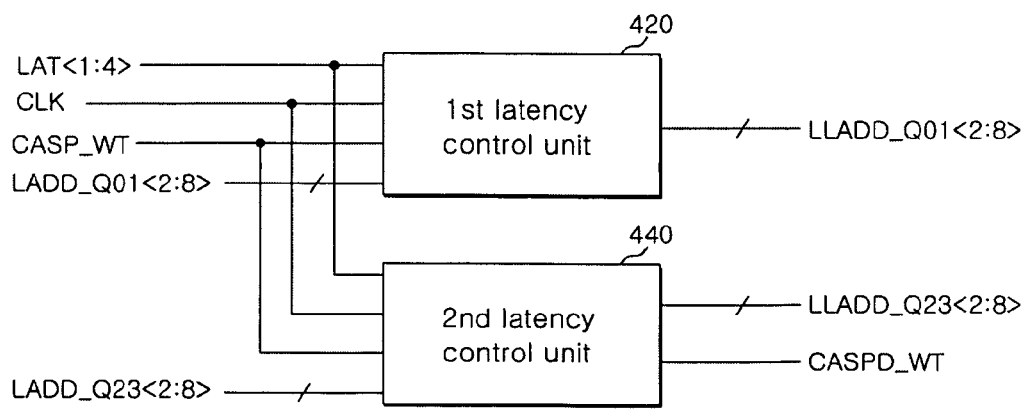
FIG. 7 is a schematic block diagram of an exemplary latency shifter capable of being implemented in the of FIG. 1 according to one embodiment.

FIG. 7 is a schematic block diagram of an exemplary latency shifter 400 capable of being implemented in FIG. 1 according to one embodiment. In FIG. 7, the latency shifter 400 can include a first latency control unit 420 and a second latency control unit 440.

The first latency control unit 420 can delay the first internal address signal 'LADD_Q01<2:8>' in response to the clock signal 'CLK' and the write command signal 'CASP_WT', and can then produce the delayed first internal address signals 'LLADD_Q01<2:8>'. In addition, the second latency control unit 440 can delay the second internal address signal 'LADD_Q23<2:8>' in response to the clock signal 'CLK' and the write command signal 'CASP_WT', and can then produce the delayed second internal address signal 'LLADD_Q23<2:8>'.

When the write command signal is activated, the latency shifter 400 can delay the write command signal 'CASP_WT' and the first and second internal address signals 'LADD_Q01<2:8>' and 'LADD_Q23<2:8>' for a predetermine time in response to the latency signals 'LAT<1:4>'. Here, the latency signal 'LAT<1:4>' can be a signal to execute the write operation.

Figure 8:
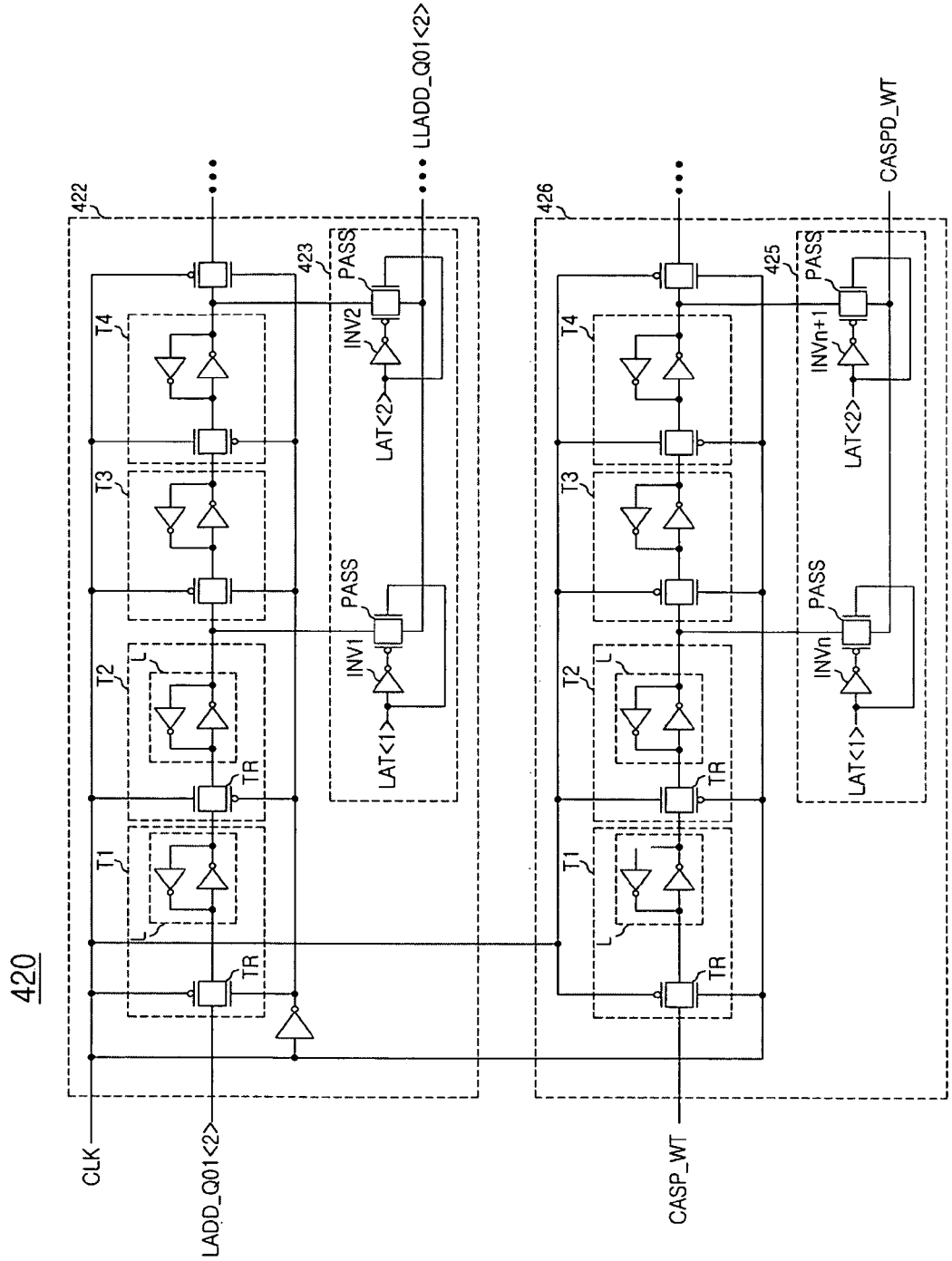
FIG. 8 is a schematic circuit diagram of an exemplary first latency control unit capable of being implemented in the shifter of FIG. 7 according to one embodiment.

FIG. 8 is a schematic circuit diagram of an exemplary first latency control unit 420 capable of being implemented in the shifter of FIG. 7 according to one embodiment. In FIG. 8, the first latency control unit 420 can include an address delay unit 422 and a command delay unit 426.

The address delay unit 422 can include a plurality of transfer units (T1, T2, T3, T4 . . . ) and a latency activation unit 423, wherein each of the transfer units (T1, T2, T3, T4 . . . ) can include a transfer gate TR and a latch unit L. Here, the first transfer unit T1 can receive and transfer the first internal address signal 'LADD_Q01<2:8>' in synchronization with a falling edge of the clock signal 'CLK'. In addition, the transfer gate TR can be turned ON in response to a low level of the clock signal 'CLK', and the latch unit L can latch the signal transferred from the transfer gate TR.

The second transfer unit T2 can receive and transfer the signal transferred from the first transfer unit T1 in synchronization with a rising edge of the clock signal 'CLK'. In addition, the transfer gate TR can be turned ON in response to a high level of the clock signal 'CLK', and the latch unit L can latch the signal transferred from the transfer gate TR.

Similarly to the second transfer unit T2, the third transfer unit T3 can receive and transfer the signal transferred from the second transfer unit T2 in synchronization with a falling edge of the clock signal 'CLK'. In addition, the transfer gate TR can be turned ON in response to a low level of the clock signal 'CLK', and the latch unit L can latch the signal transferred from the transfer gate TR.

Accordingly, the transfer units T1-T4 can be alternatively turned ON/OFF in response to the clock signal 'CLK'. Thus, the delay time can be one period of the clock signal 'CLK' between the first and third transfer units T1 and T3 or between the second and fourth transfer units T2 and T4. For example, the time difference between the turn-ON transfer unit and the turn-OFF transfer unit can be one period of the clock signal 'CLK'.

In addition, the latency activation unit 423 can transfer output signals of the transfer units (T1, T2, T3, T4 . . . ), as the first internal address signal 'LLADD_Q01<2>' in response to the latency signal 'LAT<1:4>', which can be activated based on the write latency of the semiconductor IC. Here, the latency activation unit 423 can include a pass gate PASS and inverters (INV1, INV2 . . . ) that receive the latency signals 'LAT<1:4>', respectively.

During exemplary operation of the latency activation unit 423, when the write latency is "1," the latency signal 'LAT<1>' can be activated at a high level. Accordingly, the pass gate PASS to receive the activated latency signal 'LAT<1>' can be turned ON so that an output signal of the second transfer unit T2 can be output as the delayed first internal address signal 'LLADD_Q01<2>'. Since the signal transfer time in the first and second transfer units T1 and T2 or in the third and fourth transfer units T3 and T4 has the delay time corresponding to the one period of the clock cycle, the address signal can be provided with a delay time of one clock cycle in the case where the write latency is "1."

If the write latency is "2," the latency signal 'LAT<2>' can be activated at a high level. Accordingly, the pass gate PASS to receive the activated latency signal 'LAT<2>' can be turned ON so that an output signal of the fourth transfer unit T4 can be output as the delayed first internal address signal 'LLADD_Q01<2>'. Accordingly, since the write latency is "2," the delayed first internal address signal 'LLADD_Q01<2>' can be provided with a delay time of two clock cycles.

On the other hand, the command delay unit 426 can have substantially the same configuration as the address delay unit 422. Accordingly, the difference between the command delay unit 426 and the address delay unit 422 will be described in detail.

The command delay unit 426 can provide the delayed write command signal 'CASPD_WT' by delaying the write command signal 'CASP_WT' for a predetermined time, i.e., the write latency. Thus, the write command signal 'CASP_WT' can be delayed by a predetermined clock cycle in response to the latency signal 'LAT<1:4>' that can be activated according to the write latency.

Here, the command delay unit 426 can include a plurality of transfer units (T1, T2, T3, T4 . . . ) and a latency activation unit 425. Since the plurality of transfer units (T1, T2, T3, T4 . . . ) in the command delay unit 426 can function as signal transferring units to transfer the write command signal 'CASP_WT' according to the clock signal 'CLK', the detailed description of the plurality of transfer units (T1, T2, T3, T4 . . . ) will be omitted.

As described above, the latency activation unit 425 can provides output signals of the plurality of transfer units (T1, T2, T3, T4 . . . ) as the delayed write command signal 'CASPD_WT' in response to the latency signal 'LAT<1:4>' that can be activated according to the write latency of the semiconductor IC. The latency activation unit 425 can include pass gates PASS and inverters (INV1, INV2 . . . ) which can receive bit signals of the latency signal 'LAT<1: 4>', respectively.

Accordingly, the internal address signals, which can be sequentially increased, can be output by using the external address signal. For example, the external address signal 'ADD<1:8>' can be divided into the first and second internal address signals 'LADD_Q01<2:8>' and 'LADD_Q23<2: 8>', and the second internal address signal 'LADD_Q23<2: 8>' can be set up to the initial address signal. In addition, the carry signal 'CARRY<2:8>' can be produced from the second internal address signal 'LADD_Q23<2:8>', and the sequentially increased address signals can be obtained by determining the inversion of the following address signals, i.e., the first internal address signal 'LADD_Q01<2:8>', according to the carry signal 'CARRY<2:8>'.

Although the external address signal 'ADD<0>' can be fixed to a low level, the external address signal 'ADD<0>' can also be variably input by an external circuit. Since the external address signal 'ADD<0>' can be input as a meaningful address bit, the number of cases is further taken into consideration according to the signal level of the external address signal 'ADD<0>'. For example, since two cases, i.e., low and high levels of the external address signal 'ADD<0>', are taken into consideration, carry signals, internal address signals and quarter address signals can be taken into consideration based on these two cases.

Figure 9:
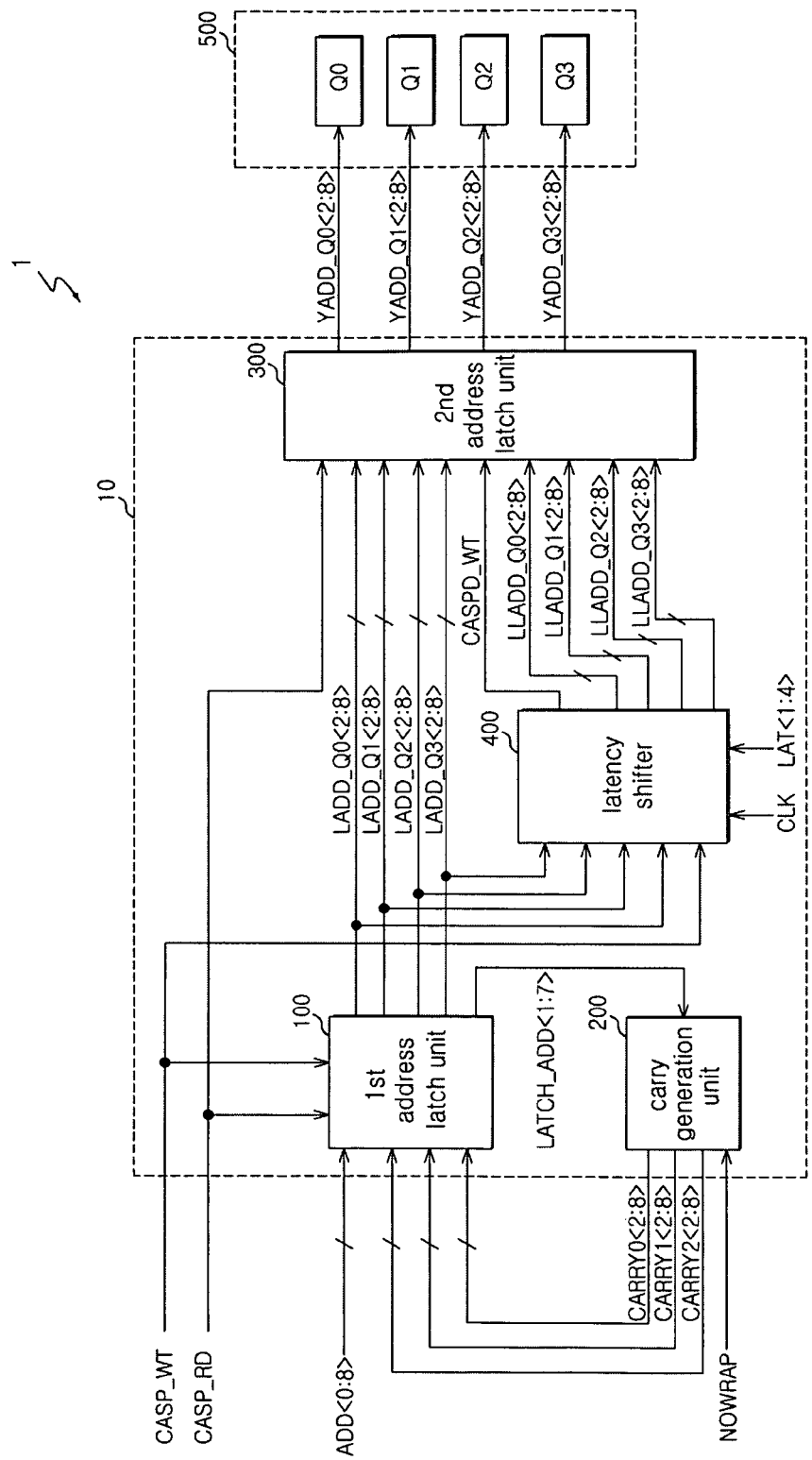
FIG. 9 is a schematic block diagram of another exemplary semiconductor IC according to another embodiment.

FIG. 9 is a schematic block diagram of another exemplary semiconductor IC 1 according to another embodiment. Differences between the semiconductor IC s of FIGS. 1 and 9 will be described in detail. However, elements designated with the same reference numerals in FIG. 1 are similar to the elements designated with the same reference numerals in FIG. 9 and, therefore, are not described in detail herein.

In FIG. 9, a first address latch unit 100 can receive external address signals 'ADD<0:8>' and first to third carry signals 'CARRY0<2:8>', 'CARRY1<2:8>', and 'CARRY2<2:8>', which can be fed back to the first address latch unit 100. In addition, the first address latch unit 100 can generates first to fourth internal address signals 'LADD_Q0<2:8>', 'LADD_Q1<2:8>', 'LADD_Q2<2:8>', and 'LADD_Q3<2: 8>' and a carry generation address signal 'LATCH_ADD<1: 7>', when receiving from an external circuit a column command signal, i.e., a read command signal or a write command signal which is executed simultaneously with the input of a column address signal. For example, the first address latch unit 100 can divide the external address signals 'ADD<0:8>' into the first to fourth internal address signals 'LADD_Q0<2: 8'>, 'LADD_Q1<2:8>', 'LADD_Q2<2:8>', and 'LADD_Q3<2:8>' in response to a read command signal 'CASP_RD' or a write command signal 'CASP_WT'. Accordingly, the fourth internal address signal 'LADD_Q3<2:8>' can be provided with substantially the same level of the external address signals 'ADD<0:8>', but the first to third internal address signals 'LADD_Q0<2:8>', 'LADD_Q1<2:8>', and 'LADD_Q2<2:8>' can be out of phase with the external address signals 'ADD<0:8>' according to the first to third feedback carry signals 'CARRY0<2: 8>', 'CARRY1<2:8>', and 'CARRY2<2:8>'. In contrast, a least significant bit (LSB) of the external address signal 'ADD<0>' can be variable and the LSB can be used to generate the carry signals.

A carry generation unit 200 can receive a sequential increasing mode signal 'NOWRAP' and the carry generation address signal 'LATCH_ADD<1:7>', can generate the carry signals 'CARRY<2:8>', and can then provide the first to third carry signals 'CARRY0<2:8>', 'CARRY1<2:8>', and 'CARRY2<2:8>' to the first address latch unit 100. When the sequential increasing mode signal 'NOWRAP' is activated, the carry generation unit 200 can produce the first to third carry signals 'CARRY0<2:8>', 'CARRY1<2:8>', and 'CARRY2<2:8>'.

For example, only the second lower bit (ADD<1>) of the external address signal can be used as an initial enable signal to generate the carry signal. However, both the LSB and the second lower bit (ADD<0:1>) of the external address signal can be used as an initial enable signal to generate the carry signal. The LSB of the external address signals can be universally used, but not a fixed level, as described in detail below.

Due to the increasing of the carry signal, the second address latch unit 300 and the latency shifter 400 can receive the first to fourth internal address signals 'LADD_Q0<2:8>', 'LADD_Q1<2:8>', 'LADD_Q2<2:8>', and 'LADD_Q3<2: 8>', which can be more increased in number than the internal address signals. Furthermore, since the second address latch unit 300 and the latency shifter 400 can latch and delay the received signals, the output signals can also be increased in number. Accordingly, as shown in FIG. 9, a memory block 500 can receive first to fourth quarter block address signals 'YADD_Q0<2:8>', 'YADD_Q1<2:8>', 'YADD_Q2<2:8>', and 'YADD_Q3<2:8>', which can be defined according to quarter blocks Q0 to Q3.

Figure 10:
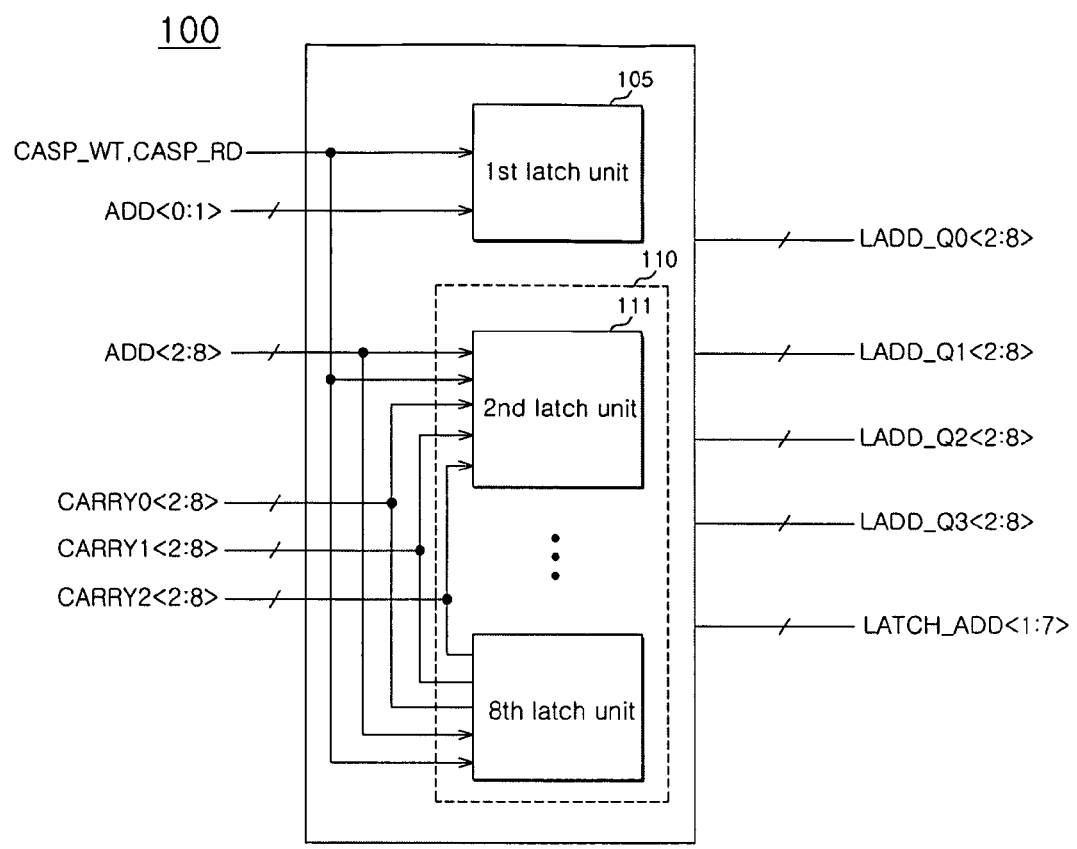
FIG. 10 is a schematic block diagram of an exemplary first address latch unit capable of being implemented in the of FIG. 9 according to one embodiment.

FIG. 10 is a schematic block diagram of an exemplary first address latch unit 100 capable of being implemented in the FIG. 9 according to one embodiment. In FIG. 10, the first address latch unit 100 can include a plurality of latch units to receive the external address signal 'ADD<0:8>'. Here, the first address latch unit 100 can include a first latch unit 105 and an internal address signal generating unit 110.

The first address latch unit 100 can receive the first to third carry signals 'CARRY0<2:8>', 'CARRY1<2:8>', and 'CARRY2<2:8>', and can then provide the first to fourth internal address signals 'LADD_Q0<2:8>', 'LADD_Q1<2: 8>', 'LADD_Q2<2:8>', and 'LADD_Q3<2:8>' by additionally using the external address signal 'ADD<0>'. This will be described in detail referring the accompanying drawing.

Four internal address signals can be produced to provide the quarter address signals, which are correspondent to the quarter blocks in the memory block. The LSB can be employed to generate the carry signals, but not actually involved in addressing the quarter blocks.

Figure 11:
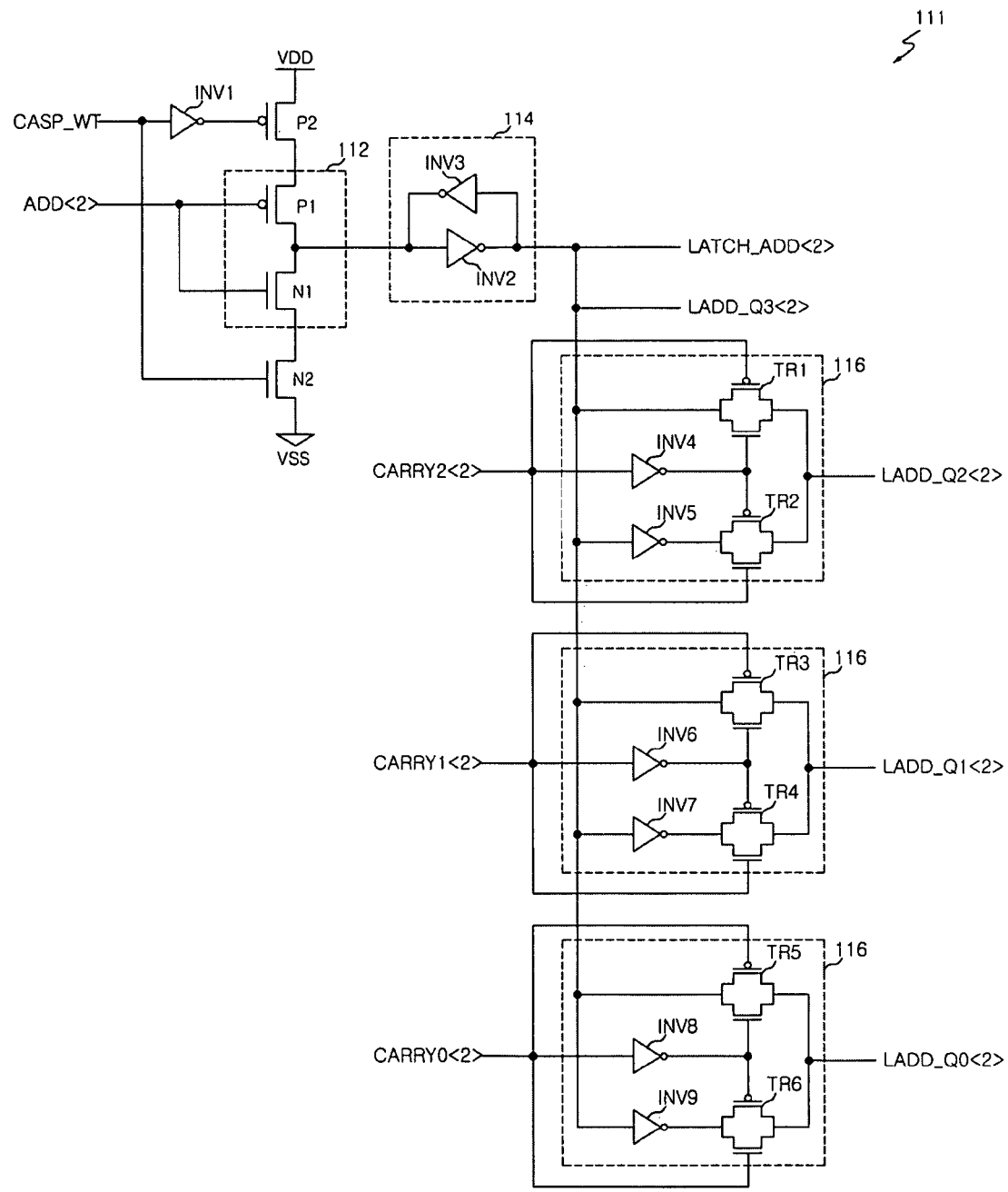
FIG. 11 is a schematic circuit diagram of an exemplary second latch unit capable of being implemented in the of FIG. 9 according to one embodiment.

FIG. 11 is a schematic circuit diagram of an exemplary second latch unit 111 capable of being implemented in the of FIG. 9 according to one embodiment. In FIG. 11, the second latch unit 111 can include a plurality of transfer units 116 to receive the first to third carry signals 'CARRY0<2:8>', 'CARRY1<2:8>', and 'CARRY2<2:8>'.

The transfer unit 116 produces the second to fourth internal address signals 'LADD_Q0<2>', 'LADD_Q1<2>', and 'LADD_Q2<2>', which can have substantially the same signal level as the fourth internal address signal 'LADD_Q3<2>' or can have inverted signal levels of the fourth internal address signal 'LADD_Q3<2>', according to the signal level of the first to third carry signals 'CARRY0<2>', 'CARRY1<2>', and 'CARRY2<2>'. Each of the transfer units 116 can also include two transfer gates (TR1 and TR2, TR3 and TR4, or TR5 and TR6) and two inverters (IV4 and IV5, IV6 and IV7, or IV8 and IV9). For example, the first transfer gate TR1 can produce the third internal address signal 'LADD_Q2<2>', which can have substantially the same signal level as the fourth internal address signal 'LADD_Q3<2>', being turned ON in response to the third carry signal 'CARRY2<2>', which can be inactivated at a low level.

The second transfer gate TR2 can also produce the third internal address signal 'LADD_Q2<2>', which can have the inverted voltage level of the fourth internal address signal 'LADD_Q3<2>', being turned ON in response to the third carry signal 'CARRY2<2>', which can be activated at a high level. For example, the second latch unit 111 can receive the address signal 'ADD<2>', and can then provide the first to fourth internal address signals 'LADD_Q0<2>', 'LADD_Q1<2>', 'LADD_Q2<2>', and 'LADD_Q3<2>', which can be independently produced. Specifically, the second latch unit 111 can determine the inversion of the second to fourth internal address signals 'LADD_Q0<2>', 'LADD_Q1<2>', and 'LADD_Q2<2>' according to the signal levels of the first to third carry signals 'CARRY0<2>', 'CARRY1<2>', and 'CARRY2<2>'.

Besides the fourth internal address signal 'LADD_Q3<2>', which can be provided with substantially the same level of the received external address, the first to third internal address signals 'LADD_Q0<2>', 'LADD_Q1<2>', and 'LADD_Q2<2>', in which the inversion of the signal level of the external address signal can be determined by the carry signals, are provided. Accordingly, the internal address signals, which can be provided to each quarter block Q0 to Q3 (in FIG. 1) in the memory block 500 (in FIG. 1), can be separated from each other.

As mentioned above, the internal address signals, which can be provided to the quarter blocks in the memory block 500 (in FIG. 9) for the received external address signal, can be separated from each other. In the case where the address signals are sequentially increased, the carry signals are required to sequentially increase the address signals. Namely, when the received address signals are divided into the quarter address signals, one carry signal group is provided, but three carry signal groups are provided to generate the internal address signals.

Figure 12:
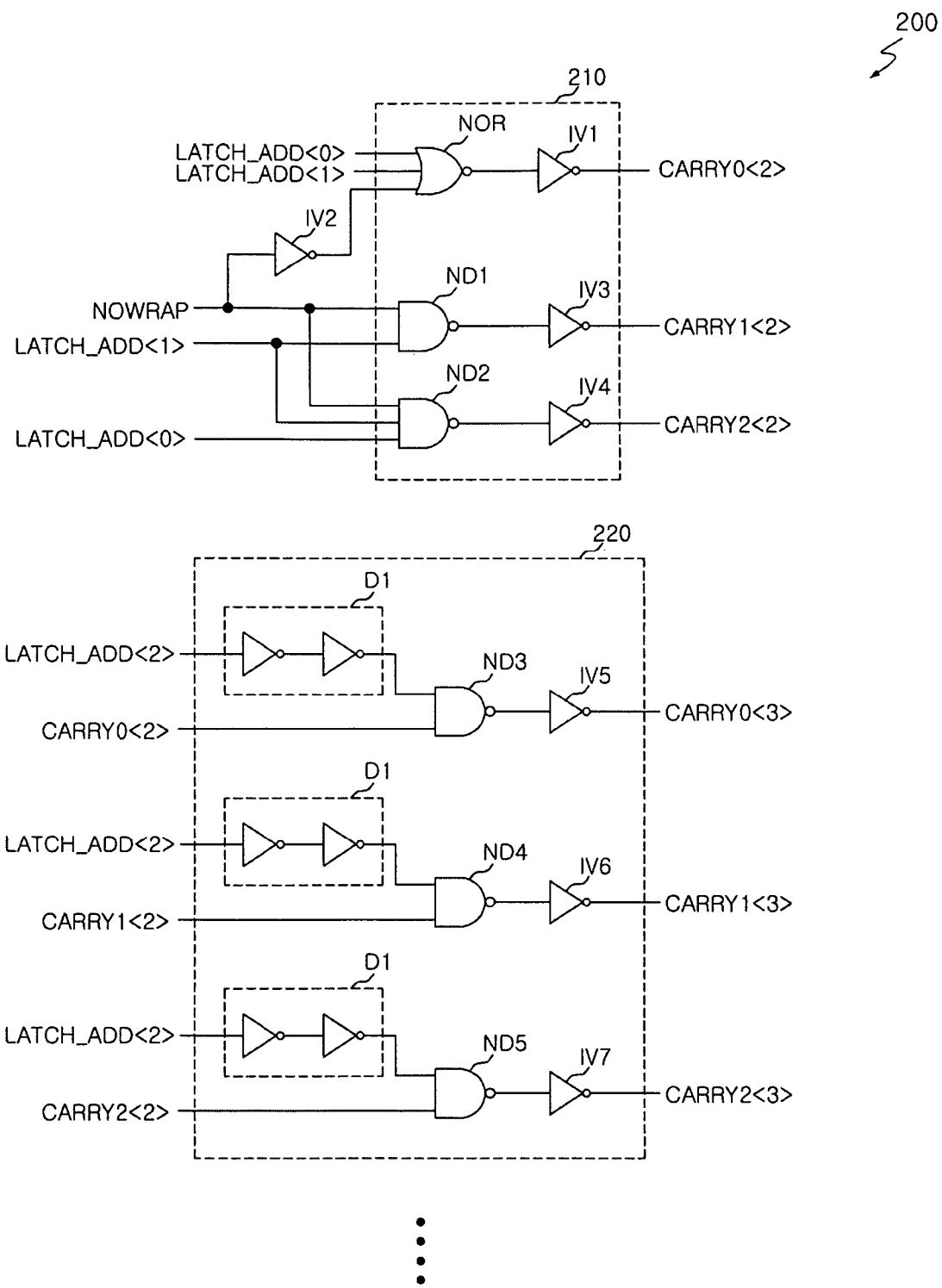
FIG. 12 is a schematic circuit diagram of an exemplary carry generation unit capable of being implemented in the FIG. 9 according to one embodiment.

FIG. 12 is a schematic circuit diagram of an exemplary carry generation unit 200 capable of being implemented in the of FIG. 9 according to one embodiment. In FIG. 12, the plurality of carry signals 'CARRY0<2:8>', 'CARRY1<2:8>', and 'CARRY2<2:8>' generated by the carry generation unit 200 can be used as the signals to continuously increase the sequential address signals from a previously received address signal. For example, the plurality of carry signals 'CARRY0<2:8>', 'CARRY1<2:8>', and 'CARRY2<2:8>' can determine an inversion from the previous address signal.

A first signal generating unit 210 can include a circuit to activate the generation of the first to third carry signals 'CARRY0<2:8>', 'CARRY1<2:8>', and 'CARRY2<2:8>'. Here, the carry signals 'CARRY0<2>', 'CARRY1<2>', and 'CARRY2<2>' of the first to third carry signals 'CARRY0<2:8>', 'CARRY1<2:8>', and 'CARRY2<2:8>' can be produced in response to a carry generation signal 'LATCH_ADD<1>' and the sequential increasing mode signal 'NOWRAP'. Accordingly, the LSB of the external address signals can be additionally involved in generating the carry signals and then the two-bit address signal can be used as the carry generation address signal. In addition, the first to third carry signals 'CARRY0<2:8>', 'CARRY1<2:8>', and 'CARRY2<2:8>' can be generated by using this carry generation address signal in order that the address signals are separately provided to each quarter block.

In FIG. 12, the first signal generating unit 210 can include a NOR gate NOR, first and second NAND gates ND1 and ND2, and first to fourth inverters IV1 to IV4. Accordingly, the NOR gate NOR can receive the carry generation signals 'LATCH_ADD<0:1>' of two bits and the sequential increasing mode signal 'NOWRAP'. An output signal of the NOR gate NOR can be inverted by the first inverter IV1 so that the carry signal 'CARRY0<2>' can be provided. In addition, the first NAND gate ND1 can perform the NAND operation of the sequential increasing mode signal 'NOWRAP' and the carry generation signal 'LATCH_ADD<1>'. Next, an output signal of the first NAND gate ND1 can be inverted by the third inverter IV3 so that the carry signal 'CARRY1<2>' is provided.

The second NAND gate ND2 can perform the NAND operation of the sequential increasing mode signal 'NOWRAP' and the carry generation signals 'LATCH_ADD<0:1>'. Next, an output signal of the second NAND gate ND2 can be inverted by the fourth inverter IV4 so that the carry signal 'CARRY2<2>' is provided. When the sequential increasing mode signal 'NOWRAP' is activated, the carry signals 'CARRY0<2>', 'CARRY1<2>', and 'CARRY2<2>' can be produced by using of the external address signals of two bits, i.e., the carry generation signals 'LATCH_ADD<0:1>'.

The second signal generating unit 220 can produce the carry signals 'CARRY0<3>', 'CARRY1<3>', and 'CARRY2<3>' in response to the carry generation signal 'LATCH_ADD<2>' and the carry signals 'CARRY0<3>', 'CARRY1<3>', and 'CARRY2<3>'. The second signal generating unit 220 can also includes a delayer D1, first to fifth NAND gates ND3 to ND5, and fifth to seventh inverters IV5 to IV7. Here, the NADN gates ND3 to ND5 can perform the NAND operation of the first signals 'CARRY0<2>', 'CARRY1<2>', and 'CARRY2<2>' of the first to third carry signals and the carry generation signal 'LATCH_ADD<2>', which can be delayed by the delayer D1. Accordingly, the delay amount of the delayer D1 can be determined to satisfy a signal generation time required to produce each of the carry signal 'CARRY0<2>', 'CARRY1<2>', and 'CARRY2<2>' of the first to third carry signals in the first signal generating unit 210.

For the sake of brevity, the third to eight carry generation units are omitted from FIG. 12. In these omitted carry generation units, the delay time can be required to stably receive the carry signals 'CARRY<2:8>' generated at the pre-stages. The carry generation units, which receive the same carry generation signal, can have substantially the same delay time. However, it is possible to provide delayers each of which can have a different delay time to each of the carry generation units.

As apparent from the above, the column address count can provide the sequential address signals. In the case where the LSB is fixed or not, the difference can be characterized in that the numbers of bits involved in generating the carry signals can be different from each other, and then the numbers of address signals can be different from each other.

While certain embodiments have been described above, it will be understood that the embodiments described are by way of example only. Accordingly, apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor IC in which a least significant bit of an external address signal is fixed to a signal level, the semiconductor integrated circuit comprising:
   an address control circuit configured to produce a carry signal, when a test mode signal is activated, in response to a column command signal and output an address signal, which is sequentially increased from an initial internal address signal, by latching the external address signal as the initial internal address signal and combining the latched initial internal address signal and the carry signal.

2. The semiconductor IC of claim 1, wherein an inversion of the external address signal is determined according to a signal level of the carry signal.

3. The semiconductor IC of claim 1, wherein the column command signal is one of a read command signal and a write command signal.

4. The semiconductor IC of claim 1, wherein the address control circuit includes:
   a first address latch unit configured to receive the external address signal and the carry signal, and produce a first internal address signal, a second internal address signal, and a carry generation address signal based on the external address signal and the carry signal;
   a carry generation unit configured to produce the carry signal by receiving the carry generation address signal in response to the test mode signal; and
   a second address latch unit configured to provide quarter address signals to designate memory blocks based on the first and second internal address signals during a read or write operation.

5. The semiconductor IC of claim 4, further comprising a latency shifter configured to delay the first and second internal address signals for a predetermined time and providing the delayed first and second internal address signals and the write command signal during a write operation.

6. The semiconductor IC of claim 4, wherein the first address latch unit includes:
   a first latch unit configured to provide a bit signal of a carry generation signal in response to the column command signal and a bit signal of the external address signal; and
   an internal address signal generating unit configured to provide second internal address signal as the initial internal address signal and inverting the first internal address signal according the signal level of the carry signal.

7. The semiconductor IC of claim 4, wherein the carry generation unit is configured to provide the carry signal at a low level when the carry generation address signal is received at a low level and provides the carry signal at a high level when the carry generation address signal is received at a high level.

8. The semiconductor IC of claim 5, wherein the second address latch unit includes:
   a first latch unit configured to latch the first and second internal address signals as the quarter address signals in response to a read command signal; and
   a second latch unit configured to latch the delayed first and second internal address signals as the quarter address signals in response to the delayed write command signal.

9. The semiconductor IC of claim 5, wherein the latency shifter has a delay time sufficient to satisfy a write latency associated with a write operation.

10. A semiconductor IC in which a least significant bit of an external address signal is fixed to a signal level, the semiconductor integrated circuit comprising:
    an address control circuit configured to receive an external address signal when a test mode signal is activated, in response to a column command signal, divide the external address signal into a first internal address signal and a second internal address signal, which is used as initial internal address signal, and provide the first internal address signal which is sequentially increased from the second internal address signal.

11. The semiconductor IC of claim 10, wherein the column command signal is one of a read command signal and a write command signal.

12. The semiconductor IC of claim 10, wherein the address control circuit includes:
    a first address latch unit configured to receive the external address signal and the carry signal, divide the external address signal into the first and second internal address signals, and provide a carry generation address signal;
    a carry generation unit configured to produce the carry signal by receiving the carry generation address signal in response to the test mode signal; and
    a second address latch unit configured to provide quarter address signals to designate memory blocks respectively in response to the first and second internal address signals during a read or write operation.

13. The semiconductor IC of claim 12, wherein an inversion of the external address signal is determined according to a signal level of the carry signal.

14. The semiconductor IC of claim 12, further comprising a latency shifter for delaying the first and second internal address signals for a predetermined time and providing the delayed first and second internal address signals and a delayed write command signal in response to a write command signal during a write operation.

15. The semiconductor IC of claim 12, wherein the first address latch unit includes:
    a first latch unit configured to provide a bit signal of a carry generation signal in response to the column command signal and a bit signal of the external address signal; and
    an internal address signal generating unit having a plurality of latch units corresponding to the bits of the external address signal other than the least significant bit, and perform latch operations in response to the carry signal.

16. The semiconductor IC of claim 15, wherein each of the latch units in the internal address signal generating unit produces portions of the second internal address signal, which have substantially the same level as the external address signal that is received in response to the column command signal, and the carry generation address signal, and produces the first internal address signal which has an inverted level of the external address signal according to the carry signal.

17. The semiconductor IC of claim 12, wherein the carry generation unit provides the carry signal at a low level when the carry generation address signals are received at a low level and provides the carry signal at a high level when the carry generation address signals are received at a high level.

18. The semiconductor IC of claim 17, wherein the carry generation unit includes a plurality of signal generating units configured to provide the carry signal in response to the received carry generation address signal.

19. The semiconductor IC of claim 18, wherein the signal generating units can include a delayer, and wherein the delay time of the delayers are different from each other.

20. The semiconductor IC of claim 12, wherein the second address latch unit includes:
- a first latch unit configured to latch the first and second internal address signals as the quarter address signals in response to a read command signal which is activated at the read operation; and
- a second latch unit configured to latch the delayed first and second internal address signals as the quarter address signals in response to a write command signal which is activated at the write operation.

21. The semiconductor IC of claim 14, wherein the predetermined time in the latency shifter has a time interval to satisfy a write latency.

22. The semiconductor IC of claim 14, wherein the latency shifter includes:
- a first latency control unit configured to provide the delayed first internal address signals in response to a clock signal, the write command signal and the first internal address signal; and
- a second latency control unit configured to provide the delayed second internal address signals in response to the clock signal, the write command signal, and the second internal address signal.

23. The semiconductor IC of claim 22, wherein the first latency control unit includes:
- a first address delay unit for delaying the first internal address signal according to the write latency; and
- a first command delay unit for delaying the write command signal according to the write latency,
- wherein the second latency control unit includes:
- a second address delay unit configured to delay the second internal address signal according to the write latency; and
- a second command delay unit configured to delay the write command signal according to the write latency.

24. The semiconductor IC of claim 23, wherein each of the first and second address delay unit includes:
- a plurality of transfer units configured to transfer the first and second internal address signals, the plurality of the transfer units turned ON in response to the clock signal; and
- a latency activation unit configured to provide the delayed first and second internal address signals, which are delayed by a predetermined latency, by providing output signals of the pass gates in response to the latency signal, the latency activation unit having pass gates that are connected to output terminals of the plurality of the transfer units.

25. The semiconductor IC of claim 23, wherein each of the first and second command delay unit includes:
- a plurality of transfer units configured to transfer the write command signal, wherein the plurality of the transfer units are turned ON in response to the clock signal; and
- a latency activation unit configured to provide the delayed write command signal, which is delayed by a predetermined latency, by providing output signals of the pass gates in response to the latency signal, wherein the latency activation unit has pass gates that are connected to output terminals of the plurality of the transfer units.

26. A semiconductor IC in which a least significant bit of an external address signal is fixed to a signal level, the semiconductor IC comprising:
- an address control circuit configured to receive an external address signal when a test mode signal is activated, in response to a column command signal and produce first and second internal address signals, wherein the first internal address signal being sequentially increased from the second internal address signal by controlling an inversion of the first internal address signal based on a signal level of the second internal address signal:
- a plurality quarter blocks configured to receive the first and second internal address signals,
- wherein the address control circuit includes:
- a first address latch unit configured to receive the external address signal and the carry signal, divide the external address signal into first and second internal address signals, and provide carry generation address signal; and
- a second address latch unit configured to provide quarter address signals to designate memory blocks in response to the first and second internal address signals at a read or write operation.

27. The semiconductor IC of claim 26, wherein the control circuit further includes a carry generation unit configured to produce the carry signal by receiving the carry generation address signal in response to the test mode signal.

28. The semiconductor IC of claim 26, wherein an inversion of the external address signal is determined according to a signal level of the carry signal which is generated at a pre-stage.

29. The semiconductor IC of claim 26, wherein the column command signal is one of a read command signal and a write command signal.

30. The semiconductor IC of claim 26, further comprising a latency shifter configured to delay the first and second internal address signals for a predetermined time and provide the delayed first and second internal address signals and the delayed write command signal in response to a write command signal, which is activated at the write operation.

31. The semiconductor IC of claim 26, wherein the first address latch unit includes:
- a first latch unit configured to provide a bit signal of a carry generation signal in response to the column command signal and a bit signal of the external address signal; and
- an internal address signal generating unit configured to provide, as the initial internal address signals, the second internal address signal and the carry generation address signal which has a same level as the second internal address signal and inverting the first internal address signal according a signal level of the carry signal.

32. The semiconductor IC of claim 26, wherein the carry generation unit provides the carry signal at a low level when the carry generation address signal are received at a low level and provides the carry signal at a high level when the carry generation address signals are received at a high level.

33. The semiconductor IC of claim 32, wherein the carry generation unit includes a plurality of signal generating units configured to provide the carry signal in response to the received carry generation address signal.

34. The semiconductor IC of claim 33, wherein the signal generating units each include a delayer, and wherein the delay times of the delayers are different from each other.

35. The semiconductor IC of claim 26, wherein the second address latch unit includes:
- a first latch unit configured to latch the first and second internal address signals as the quarter address signals in response to a read command signal, which is activated at the read operation; and
- a second latch unit for latching the delayed first and second internal address signals as the quarter address signals in response to a write command signal, which is activated at the write operation.

36. The semiconductor IC of claim 30, wherein the predetermined time in the latency shifter has a time interval to satisfy a write latency.

37. The semiconductor IC of claim 30, wherein the latency shifter includes:
- a first latency control unit configured to provide the delayed first internal address signals in response to a clock signal, the write command signal and the first internal address signal; and
- a second latency control unit configured to provide the delayed second internal address signals in response to the clock signal, the write command signal and the second internal address signal.

38. The semiconductor IC of claim 37, wherein the first latency control unit includes:
- a first address delay unit configured to delay the first internal address signal by the write latency; and
- a first command delay unit configured to delay the write command signal by the write latency, wherein the second latency control unit includes:
- a second address delay unit configured to delay the second internal address signal by the write latency; and
- a second command delay unit configured to delay the write command signal by the write latency.

39. The semiconductor IC of claim 38, wherein each of the first and second address delay unit includes:
- a plurality of transfer units configured to transfer the first and second internal address signals, the plurality of the transfer units being turned ON in response to the clock signal; and
- a latency activation unit configured to provide the delayed first and second internal address signals, which are delayed by a predetermined latency, by providing output signals of the pass gates in response to the latency signal, wherein the latency activation unit has pass gates that are connected to output terminals of the plurality of the transfer units.

40. The semiconductor IC of claim 38, wherein each of the first and second command delay unit includes:
- a plurality of transfer units configured to transfer the write command signal, the plurality of the transfer units being turned ON in response to the clock signal; and
- a latency activation unit configured to provide the delayed write command signal, which is delayed by a predetermined latency, by providing output signals of the pass gates in response to the latency signal, wherein the latency activation unit has pass gates that are connected to output terminals of the plurality of the transfer units.

41. A semiconductor IC comprising an address control circuit configured to receive an external address signal, when a test mode signal is activated, in response to a column command signal, produce first to fourth internal address signals which are respectively correspondent to memory quarter blocks, and control an inversion of the first to third internal address signals based on a signal level of the fourth internal address signal in order that the first to third internal address signals are sequentially increased from the fourth internal address signal.

* * * * *